United States Patent
Hemani et al.

(10) Patent No.: US 12,387,956 B2
(45) Date of Patent: Aug. 12, 2025

(54) SYSTEMS AND METHODS FOR CONTROLLING NON-UNIFORMITY

(71) Applicant: Applied Materials, Inc., Santa Clara, CA (US)

(72) Inventors: Gautam K. Hemani, San Jose, CA (US); Khokan Chandra Paul, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 784 days.

(21) Appl. No.: 17/094,520

(22) Filed: Nov. 10, 2020

(65) Prior Publication Data
US 2021/0143039 A1    May 13, 2021

Related U.S. Application Data (60) Provisional application No. 62/934,301, filed on Nov. 12, 2019.

(51) Int. Cl.
*H01L 21/67* (2006.01)
*G01N 21/95* (2006.01)
*H01L 21/66* (2006.01)

(52) U.S. Cl.
CPC ... *H01L 21/67288* (2013.01); *G01N 21/9505* (2013.01); *H01L 21/67063* (2013.01); *H01L 22/20* (2013.01)

(58) Field of Classification Search
CPC ......... H01L 21/67288; H01L 21/67063; H01L 21/67253; H01L 21/67103; H01L 22/12;
(Continued)

(56) References Cited

U.S. PATENT DOCUMENTS 9,528,945 B2 * 12/2016 Handler ............... G01N 21/255
10,553,623 B2 * 2/2020 Walecki ............ G01R 31/2648
(Continued)

FOREIGN PATENT DOCUMENTS

CN    1685220 A  * 10/2005  ............. G01N 21/47
EP    1860428 A2 * 11/2007  ......... G01N 21/8806
(Continued)

OTHER PUBLICATIONS

International Search Report and Written Opinion mailed Mar. 17, 2021 in International Patent Application No. PCT/US2020/059850, 11 pages.
(Continued)

*Primary Examiner* — Michael P Stafira
(74) *Attorney, Agent, or Firm* — Kilpatrick Townsend & Stockton LLP (57) ABSTRACT

Methods of controlling stress non-uniformity for semiconductor processing may include reflecting light off a surface of a wafer with an optical imaging device disposed within a cluster tool. The cluster tool may include a multi-chamber processing system. The methods may include collecting one or more color images of the surface of the wafer. The methods may include converting the one or more color images to sample stress intensity data comparing the sample stress intensity data to reference wafer stress intensity data. The methods may include identifying deviations of the sample stress intensity data relative to the reference wafer stress intensity data. The methods may include determining corrective actions for bringing the sample stress intensity data into conformity with the reference wafer stress intensity data. The methods may include implementing the corrective actions on the multi-chamber processing system.

17 Claims, 6 Drawing Sheets

(58) Field of Classification Search
CPC ....... G01B 11/16; G01B 11/255; G01B 11/30; G01B 11/303; G01B 11/306
See application file for complete search history.

(56) References Cited

U.S. PATENT DOCUMENTS

| | | | | |
|---|---|---|---|---|
| 2004/0012775 | A1* | 1/2004 | Kinney | G01N 21/9501 356/237.2 |
| 2005/0066739 | A1* | 3/2005 | Gotkis | B24B 49/16 73/760 |
| 2005/0179910 | A1* | 8/2005 | Bartov | G06T 7/0004 382/145 |
| 2007/0196011 | A1* | 8/2007 | Cox | H01L 21/67167 382/145 |
| 2010/0189339 | A1* | 7/2010 | Amanullah | G01N 21/8806 382/145 |
| 2010/0241250 | A1* | 9/2010 | Chen | G05B 13/042 700/121 |
| 2014/0212050 | A1* | 7/2014 | Zhou | G06T 7/155 382/205 |
| 2016/0035603 | A1* | 2/2016 | Ikenoue | B23K 26/354 219/121.65 |
| 2018/0308971 | A1 | 10/2018 | Walecki et al. | |

FOREIGN PATENT DOCUMENTS

| | | | | |
|---|---|---|---|---|
| EP | 2990775 B1 | * | 3/2021 | ........... G01N 21/255 |
| JP | H09178663 A | * | 7/1997 | |
| JP | 2016-219746 A | | 12/2016 | |
| KR | 10-1383949 B1 | | 4/2014 | |
| WO | WO-0240970 A1 | * | 5/2002 | ......... G01N 21/9501 |

OTHER PUBLICATIONS

Application No. PCT/US2020/059850, International Preliminary Report on Patentability, Mailed on May 27, 2022, 8 pages.

* cited by examiner

SYSTEMS AND METHODS FOR CONTROLLING NON-UNIFORMITY

CROSS REFERENCES TO RELATED APPLICATIONS

This application claims the benefit of priority to U.S. Provisional Patent Application No. 62/934,301 filed Nov. 12, 2019, the contents of which are hereby incorporated by reference in their entirety for all purposes.

TECHNICAL FIELD

The present technology relates to semiconductor systems, processes, and methods. More specifically, the present technology relates to semiconductor systems and methods for controlling non-uniformity.

BACKGROUND

Integrated circuits are made possible by processes which produce intricately patterned material layers on substrate surfaces. Improvements in chip performance, power, and area/cost are continuously sought. Integrating metrology into process systems and chambers may improve chip properties and yield. Chemical mechanical planarization (CMP) semiconductor manufacturing processing techniques have corrected for critical dimension variations, such as film thickness. However, properties such as tensile stress have required contact with the semiconductor wafer sample for measurements taken before and after processing. A need exists to correlate properties, other than thickness, using wafer surface images to provide improvements in chip processing, properties, performance, and yield.

Thus, there is a need for improved systems and methods that can be used to measure properties, including performing in-vacuum colorimetry measurements, and to provide analysis in real-time to make corrections as needed. These and other needs are addressed by the present technology.

SUMMARY

Methods of controlling stress non-uniformity for semiconductor processing may include reflecting light off a surface of a wafer with an optical imaging device disposed within a cluster tool. The cluster tool may include a multi-chamber processing system. The methods may include collecting one or more color images of the surface of the wafer. The methods may include converting the one or more color images to sample stress intensity data comparing the sample stress intensity data to reference wafer stress intensity data. The methods may include identifying deviations of the sample stress intensity data relative to the reference wafer stress intensity data. The methods may include determining corrective actions for bringing the sample stress intensity data into conformity with the reference wafer stress intensity data. The methods may include implementing the corrective actions on the multi-chamber processing system.

The methods may include transferring the wafer from a first semiconductor processing chamber to the optical imaging device. The transferring may be performed while maintaining vacuum conditions on the multi-chamber processing system. The methods may include transferring the wafer from the optical imaging device to a second semiconductor processing chamber. The sample stress intensity data may be rgb space pixel variation data. The optical imaging device may include a light source directed to the surface of the wafer at an angle offset from perpendicular to a surface of the wafer. The optical imaging device may include collecting reflectance data at a line of sight perpendicular to a surface of the wafer. Implementing the corrective actions on the multi-chamber processing system may include at least one of changing a process recipe, cleaning a process chamber, or replacing a process component. The process component may be or include a showerhead.

Some embodiments of the present technology may encompass methods of controlling non-uniformity for semiconductor processing. The methods may include imaging a reference wafer with an optical imaging device disposed within a cluster tool to generate reflectance data from a reference surface. The cluster tool may include a multi-chamber processing system. The methods may include imaging a sample wafer with the optical imaging device to generate reflectance data from a sample surface. The methods may include translating the reflectance data from the reference surface to a first set of rgb space pixel variation data with a processor. The methods may include translating the reflectance data from the sample surface to a second set of rgb space pixel variation data. The methods may include identifying deviations between the second set of rgb space pixel variation data relative to the first set of rgb space pixel variation data. The methods may include determining corrective actions for bringing the second set of rgb space pixel variation data into conformity with the first set of rgb space pixel variation data. The methods may include implementing the corrective actions into the multi-chamber processing system.

In some embodiments, the methods may include imaging a plurality of reference wafers with the optical imaging device to generate reflectance data from a plurality of reference surfaces to provide a reference data library. The methods may include transferring the sample wafer from a first semiconductor processing chamber to the optical imaging device. The transferring may be performed while maintaining vacuum conditions on the multi-chamber processing system. The methods may include transferring the sample wafer from the optical imaging device to a second semiconductor processing chamber. The transferring may be performed while maintaining vacuum conditions on the multi-chamber processing system.

Some embodiments of the present technology may encompass multi-chamber processing systems. The systems may include an optical imaging device configured to image a sample wafer surface and to collect sample reflectance data. The systems may include at least one semiconductor processing chamber. The systems may include a processing device configured to translate the sample reflectance data to a sample plot of pixel variation in rgb space. The processing device may be configured to compare the sample plot of pixel variation in rgb space with a reference plot of pixel variation in rgb space. The processing device may be configured to provide feed forward corrective actions to processing variables to bring the sample plot of pixel variation in rgb space into conformity with the reference plot of pixel variation in rgb space.

In some embodiments, the systems may include a buffer chamber, and the optical imaging device may be disposed within the buffer chamber and configured to image a wafer without contacting the wafer. The optical imaging device may be configured to image the sample wafer surface while maintaining vacuum conditions on the multi-chamber processing system. The optical imaging device may be disposed within a load lock area for imaging a wafer without contacting the wafer.

Such technology may provide numerous benefits over conventional systems and techniques. For example, processes may provide increased uniformity of processes performed. Additionally, the imaging systems may be able to identify system-level issues without sacrificing substrates. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and components for semiconductor processing for controlling non-uniformity. For example, during processing to apply thin films to semiconductor substrates, such as with plasma-enhanced chemical vapor deposition films, variations in thickness, stress, and bow may occur. These challenges may lead to performance and reliability issues.

Conventional technology has required contact with the semiconductor wafer sample for stress measurements to be taken before and/or after film deposition. This may lead to scrapping substrates on which processes have already bene performed, as defects and issues may not be recognized until after processing has occurred. The present technology overcomes these issues using an optical imaging device to collect wafer data without contacting the wafers, such as by producing color images based on reflectance factors in real-time, which may be advantageously performed in-vacuum in some embodiments. The optical imaging device may be included in the processing system or the cluster tool, such as integrated into a load lock area. Alternatively, the optical imaging device may be integrated into a buffer chamber. The collected wafer color images may be correlated to stress using color analysis to identify image intensities within a wafer as well as compared to reference wafer library data. The data collected may be correlated to stress intensity variations. Other property data may also be collected, compared to reference wafer library data, and corrective actions may be directed to the semiconductor processing system.

Corrective actions may include changing the processing recipe or may include other process related modifications such as chamber cleaning or showerhead replacement. By utilizing a feed-forward process algorithm, subsequent processing may be appropriately tuned to bring processes and equipment within statistical process control for higher yield. Accordingly, this may ensure that corrections may be implemented for slower process-drift issues, as well as early detection for hardware or system issues that may be resolved prior to yield loss. For example, increased precursor flow rate, changes in processing conditions may be implemented to adjust a process output. Similarly, defects may indicate that a chamber component requires cleaning, or potentially has been compromised and should be replaced, based on comparisons to data in a reference library of known defects and the identified issue and/or solution implemented. This may allow minimal losses, or may perform corrective actions prior to loss of substrates.

Figure 1:
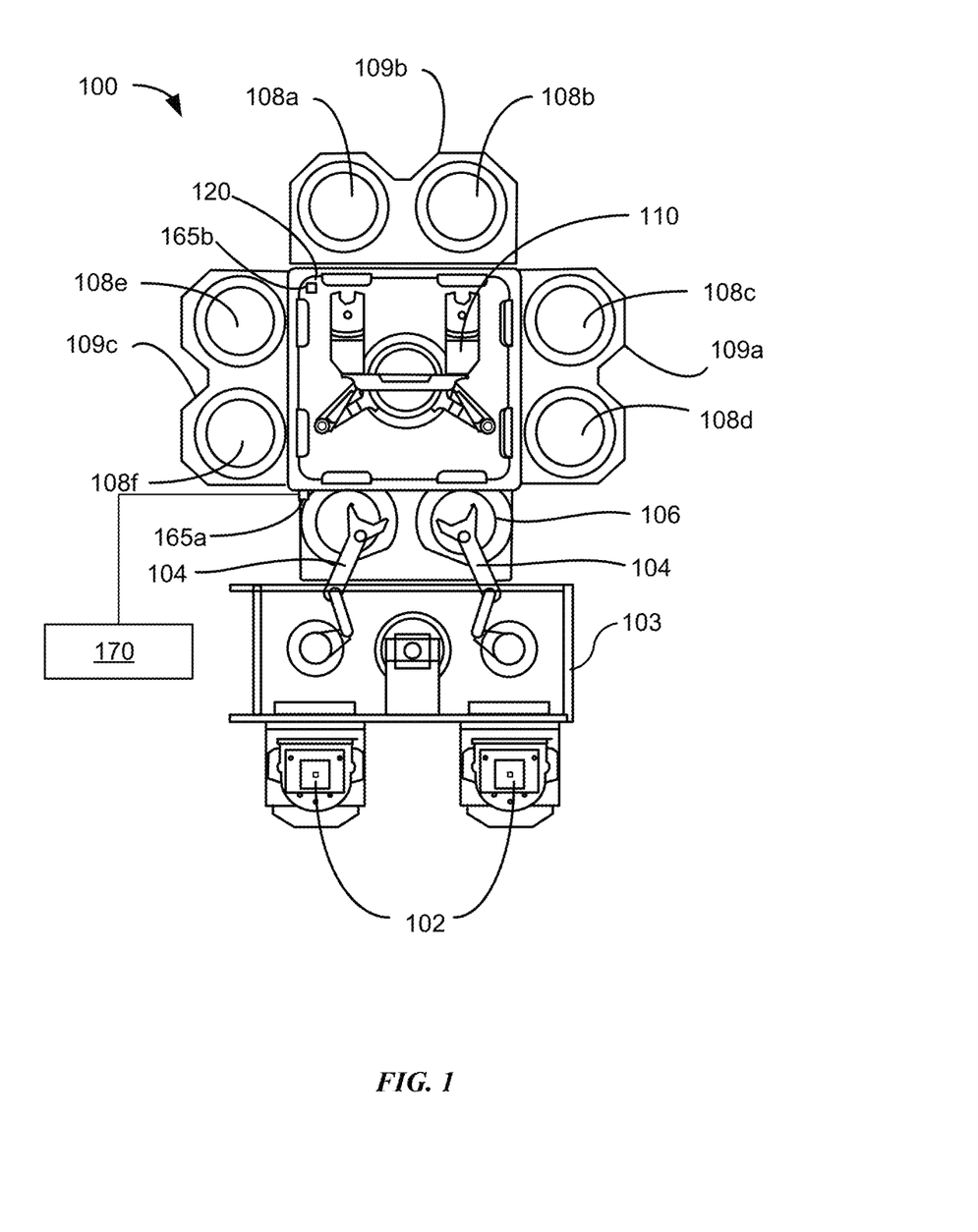
FIG. 1 shows a top plan view of an exemplary processing system according to embodiments of the present technology.

FIG. 1 shows a top plan view of one embodiment of a processing system 100 of deposition, etching, baking, and curing chambers according to embodiments of the present technology. In the figure, a pair of front opening unified pods 102 supply substrates of a variety of sizes that are received within a factory interface 103 by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, degas, orientation, and other substrate processes.

The substrate processing chambers 108a-f may include one or more system components for depositing, annealing, curing and/or etching any number of metal or dielectric materials on the substrate wafer. In one configuration, two pairs of the processing chambers, e.g., 108c-d and 108e-f, may be used to deposit material on the substrate, and the third pair of processing chambers, e.g., 108a-b, may be used to etch the deposited materials. In another configuration, all three pairs of chambers, e.g., 108a-f, may be configured to etch a material layer on the substrate. Any one or more of the processes described may be carried out in one or more chamber separated from the fabrication system shown in different embodiments. It will be appreciated that additional configurations of deposition, etching, annealing, and curing chambers for dielectric films are contemplated by system 100. Any number of the structures or layers described throughout the present disclosure may be formed in one or more chambers incorporated with a system like system 100, or any other processing system in which semiconductor fabrication may be performed.

An optical imaging device 165 may be disposed within processing system 100 to collect data before and/or after film deposition or other process operations. The optical imaging device 165 may be located within a lock load area or within a buffer chamber or area. For example, the optical imaging device, device 165*a* as shown in FIG. 1, may be located within the low pressure load lock holding area 106 for imaging semiconductor wafers with the wafers being positioned into place for imaging by robotic arms 104 controllable with factory interface 103. Alternatively, the optical imaging device, device 165*b* as shown in FIG. 1, may be disposed within buffer chamber 120 maintaining vacuum conditions, the buffer chamber being generally surrounded by processing chambers 108*a-f*. The wafers may be positioned into place for imaging within the buffer chamber 120 by robotic arms 110. In some embodiments, the optical imaging device may be configured to collect wafer surface images in color. Advantageously, an optical imaging device positioned within buffer chamber 120 collects images without breaking vacuum, which may reduce surface contamination during processing.

Additionally processing system 100 may include a processing device 170, which may be communicatively coupled with the optical imaging device 165*a* as in FIG. 1. In another example, the processing device 170 may be communicatively coupled with optical imaging device 165*b*. Optical imaging device 165 may include a number of different components, and in some embodiments may include a light source and an imager as will be described in detail below. Processing device 170 may be a computer, server, or other computational device. In some embodiments, processing device 170 may be part of a semiconductor processing system server, as well as an internal processing unit of the detector, which may be in communication with a system server. The coupling may be wired or wireless in embodiments, and may provide imaging data to the computer for processing and interpretation as will be described in detail below. Processing device 170 may have one or more processors for controlling any of the noted components. The processors may be communicatively coupled with memory and other storage or networking features. Processing device 170 may include neural networking features. Certain aspects of processing device 170 will be described in more detail below.

Cluster tools often process a number of substrates by continuously passing substrates through a series of chambers and process operations. The process recipes and sequences will typically be programmed into a microprocessor controller that will direct, control, and monitor the processing of each substrate through the cluster tool. In some embodiments, the microprocessor controller is integrated into the processing device 170. In some embodiments, the processing device 170 may provide instructions such as corrective actions to bring the wafers into uniformity based upon reflectance data collected by optical imaging device 165.

Figure 2:
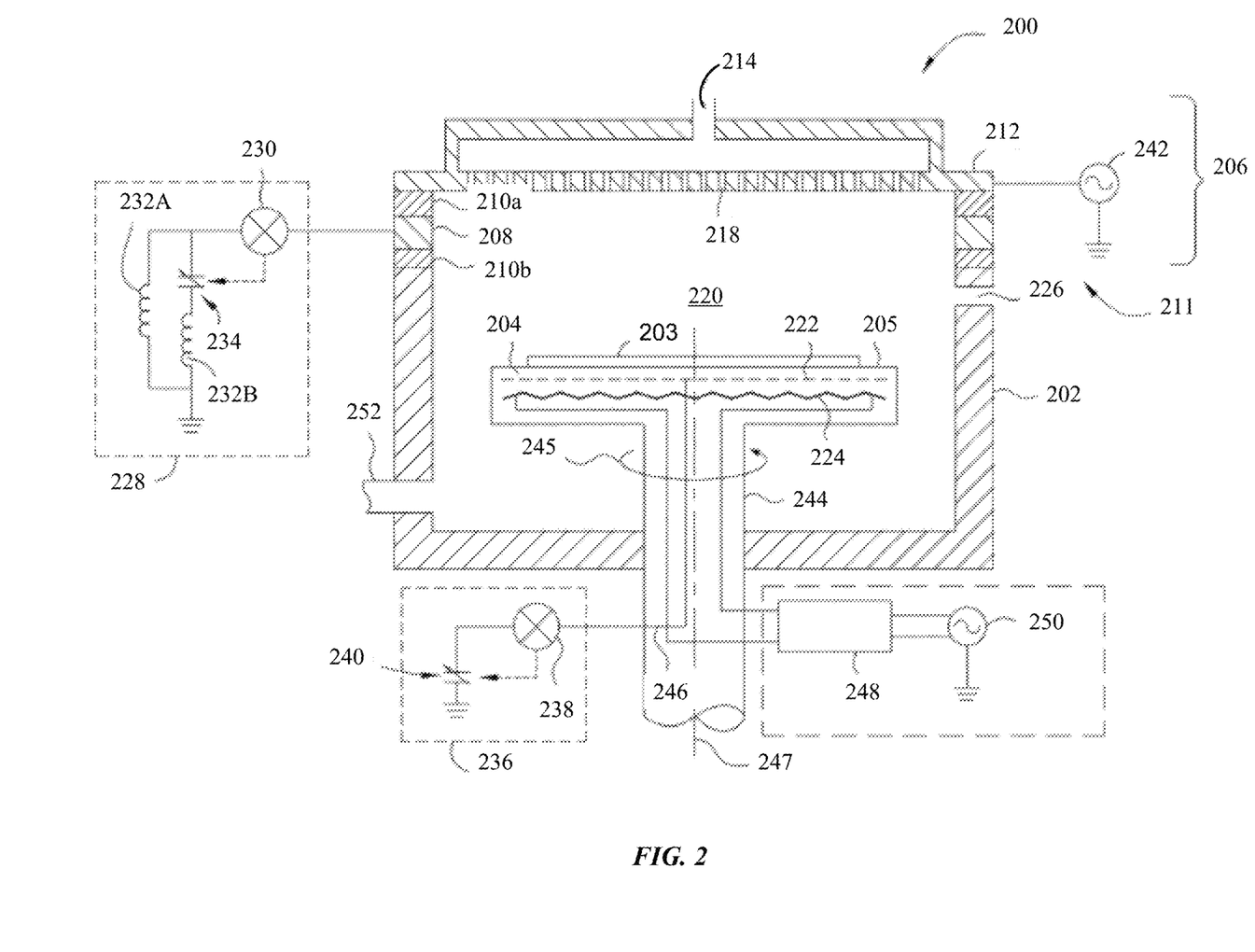
FIG. 2 shows a schematic cross-sectional view of an exemplary processing chamber according to some embodiments of the present technology.

FIG. 2 shows a cross-sectional view of an exemplary processing chamber 200 according to some embodiments of the present technology. The figure may illustrate an overview of a system incorporating one or more aspects of the present technology, and/or which may perform one or more operations according to embodiments of the present technology. Additional details of chamber 200 or methods performed may be described further below. Chamber 200 may be utilized to form film layers according to some embodiments of the present technology, although it is to be understood that the methods may similarly be performed in any chamber within which film formation may occur. The processing chamber 200 may include a chamber body 202, a substrate support 204 disposed inside the chamber body 202, and a lid assembly 206 coupled with the chamber body 202 and enclosing the substrate support 204 in a processing volume 220. A substrate 203 may be provided to the processing volume 220 through an opening 226, which may be conventionally sealed for processing using a slit valve or door. The substrate 203 may be seated on a surface 205 of the substrate support during processing. The substrate support 204 may be rotatable, as indicated by the arrow 245, along an axis 247, where a shaft 244 of the substrate support 204 may be located. Alternatively, the substrate support 204 may be lifted up to rotate as necessary during a deposition process.

A plasma profile modulator 211 may be disposed in the processing chamber 200 to control plasma distribution across the substrate 203 disposed on the substrate support 204. The plasma profile modulator 211 may include a first electrode 208 that may be disposed adjacent to the chamber body 202, and may separate the chamber body 202 from other components of the lid assembly 206. The first electrode 208 may be part of the lid assembly 206, or may be a separate sidewall electrode. The first electrode 208 may be an annular or ring-like member, and may be a ring electrode. The first electrode 208 may be a continuous loop around a circumference of the processing chamber 200 surrounding the processing volume 220, or may be discontinuous at selected locations if desired. The first electrode 208 may also be a perforated electrode, such as a perforated ring or a mesh electrode, or may be a plate electrode, such as, for example, a secondary gas distributor.

One or more isolators 210*a*, 210*b*, which may be a dielectric material such as a ceramic or metal oxide, for example aluminum oxide and/or aluminum nitride, may contact the first electrode 208 and separate the first electrode 208 electrically and thermally from a gas distributor 212 and from the chamber body 202. The gas distributor 212 may define apertures 218 for distributing process precursors into the processing volume 220. The gas distributor 212 may be coupled with a first source of electric power 242, such as an RF generator, RF power source, DC power source, pulsed DC power source, pulsed RF power source, or any other power source that may be coupled with the processing chamber. In some embodiments, the first source of electric power 242 may be an RF power source.

The gas distributor 212 may be a conductive gas distributor or a non-conductive gas distributor. The gas distributor 212 may also be formed of conductive and non-conductive components. For example, a body of the gas distributor 212 may be conductive while a face plate of the gas distributor 212 may be non-conductive. The gas distributor 212 may be powered, such as by the first source of electric power 242 as shown in FIG. 2, or the gas distributor 212 may be coupled with ground in some embodiments.

The first electrode 208 may be coupled with a first tuning circuit 228 that may control a ground pathway of the processing chamber 200. The first tuning circuit 228 may include a first electronic sensor 230 and a first electronic controller 234. The first electronic controller 234 may be or include a variable capacitor or other circuit elements. The first tuning circuit 228 may be or include one or more inductors 232. The first tuning circuit 228 may be any circuit that enables variable or controllable impedance under the plasma conditions present in the processing volume 220 during processing. In some embodiments as illustrated, the first tuning circuit 228 may include a first circuit leg and a second circuit leg coupled in parallel between ground and the first electronic sensor 230. The first circuit leg may include a first inductor 232A. The second circuit leg may include a second inductor 232B coupled in series with the first electronic controller 234. The second inductor 232B may be disposed between the first electronic controller 234 and a node connecting both the first and second circuit legs to the first electronic sensor 230. The first electronic sensor 230 may be a voltage or current sensor and may be coupled with the first electronic controller 234, which may afford a degree of closed-loop control of plasma conditions inside the processing volume 220.

A second electrode 222 may be coupled with the substrate support 204. The second electrode 222 may be embedded within the substrate support 204 or coupled with a surface of the substrate support 204. The second electrode 222 may be a plate, a perforated plate, a mesh, a wire screen, or any other distributed arrangement of conductive elements. The second electrode 222 may be a tuning electrode, and may be coupled with a second tuning circuit 236 by a conduit 246, for example a cable having a selected resistance, such as 50 ohms, for example, disposed in the shaft 244 of the substrate support 204. The second tuning circuit 236 may have a second electronic sensor 238 and a second electronic controller 240, which may be a second variable capacitor. The second electronic sensor 238 may be a voltage or current sensor, and may be coupled with the second electronic controller 240 to provide further control over plasma conditions in the processing volume 220.

A third electrode 224, which may be a bias electrode and/or an electrostatic chucking electrode, may be coupled with the substrate support 204. The third electrode may be coupled with a second source of electric power 250 through a filter 248, which may be an impedance matching circuit. The second source of electric power 250 may be DC power, pulsed DC power, RF bias power, a pulsed RF source or bias power, or a combination of these or other power sources. In some embodiments, the second source of electric power 250 may be an RF bias power.

The lid assembly 206 and substrate support 204 of FIG. 2 may be used with any processing chamber for plasma or thermal processing. In operation, the processing chamber 200 may afford real-time control of plasma conditions in the processing volume 220. The substrate 203 may be disposed on the substrate support 204, and process gases may be flowed through the lid assembly 206 using an inlet 214 according to any desired flow plan. Gases may exit the processing chamber 200 through an outlet 252. Electric power may be coupled with the gas distributor 212 to establish a plasma in the processing volume 220. The substrate may be subjected to an electrical bias using the third electrode 224 in some embodiments.

Upon energizing a plasma in the processing volume 220, a potential difference may be established between the plasma and the first electrode 208. A potential difference may also be established between the plasma and the second electrode 222. The electronic controllers 234, 240 may then be used to adjust the flow properties of the ground paths represented by the two tuning circuits 228 and 236. A set point may be delivered to the first tuning circuit 228 and the second tuning circuit 236 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 228, 236 may have a variable impedance that may be adjusted using the respective electronic controllers 234, 240. Where the electronic controllers 234, 240 are variable capacitors, the capacitance range of each of the variable capacitors, and the inductances of the first inductor 232A and the second inductor 232B, may be chosen to provide an impedance range. This range may depend on the frequency and voltage characteristics of the plasma, which may have a minimum in the capacitance range of each variable capacitor. Hence, when the capacitance of the first electronic controller 234 is at a minimum or maximum, impedance of the first tuning circuit 228 may be high, resulting in a plasma shape that has a minimum aerial or lateral coverage over the substrate support. When the capacitance of the first electronic controller 234 approaches a value that minimizes the impedance of the first tuning circuit 228, the aerial coverage of the plasma may grow to a maximum, effectively covering the entire working area of the substrate support 204. As the capacitance of the first electronic controller 234 deviates from the minimum impedance setting, the plasma shape may shrink from the chamber walls and aerial coverage of the substrate support may decline. The second electronic controller 240 may have a similar effect, increasing and decreasing aerial coverage of the plasma over the substrate support as the capacitance of the second electronic controller 240 may be changed.

The electronic sensors 230, 238 may be used to tune the respective circuits 228, 236 in a closed loop. A set point for current or voltage, depending on the type of sensor used, may be installed in each sensor, and the sensor may be provided with control software that determines an adjustment to each respective electronic controller 234, 240 to minimize deviation from the set point. Consequently, a plasma shape may be selected and dynamically controlled during processing. It is to be understood that, while the foregoing discussion is based on electronic controllers 234, 240, which may be variable capacitors, any electronic component with adjustable characteristic may be used to provide tuning circuits 228 and 236 with adjustable impedance.

Figure 3:
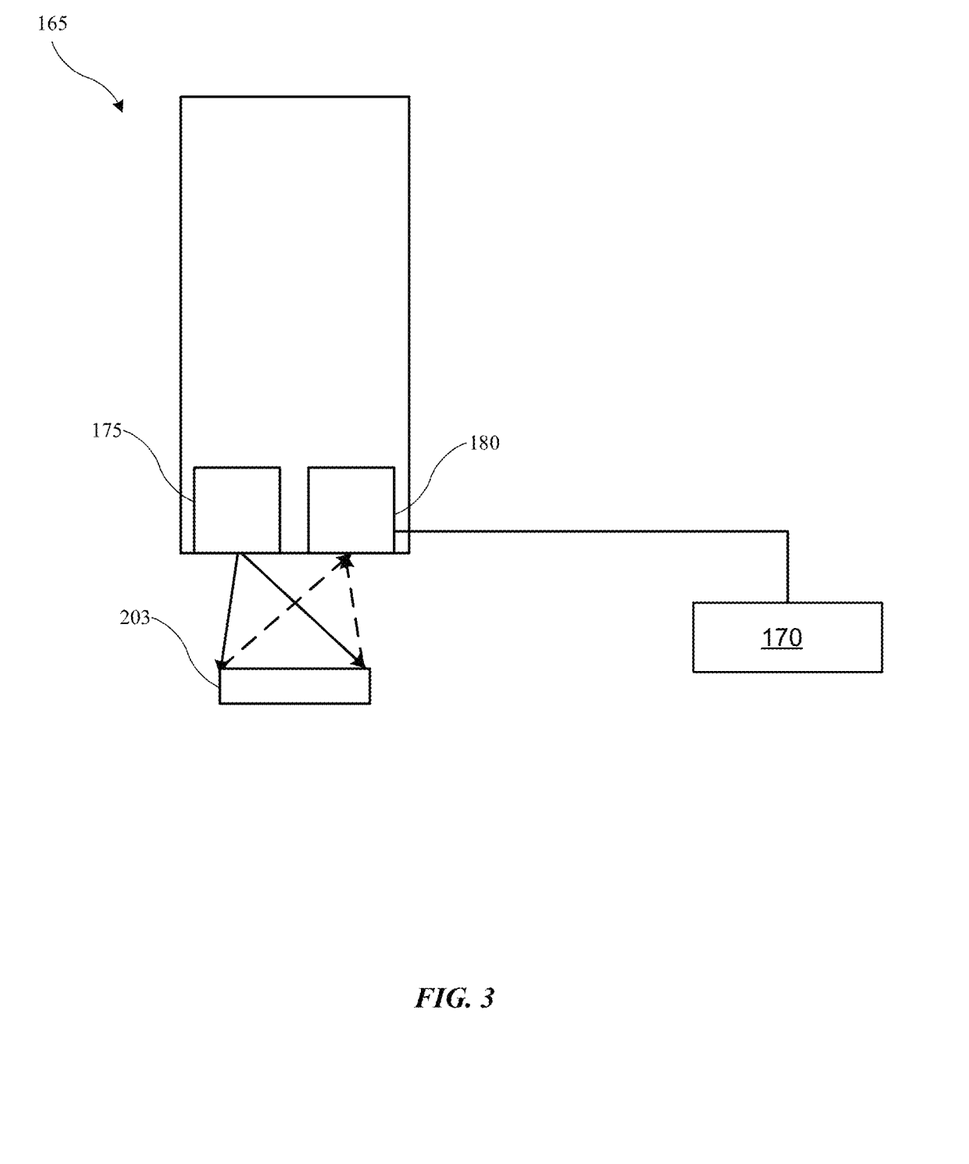
FIG. 3 shows an optical imaging device configured to image of a semiconductor wafer according to some embodiments of the present technology.

FIG. 3 shows schematically an optical imaging device 165 according to some embodiments of the present technology. Optical imaging device 165 may include a light source 175 and an imager 180 configured for colorimetry setup. The light source 175 may direct light onto a surface of the semiconductor wafer 203. The imager 180 may then receive the reflected images and provide reflectance data to processing device 170. In some embodiments, the imager may be a spectrometer or RGB camera for spectral imaging. Spectral imaging may generate spatially resolved absolute color measurements for in-process inspection for production applications. The optical imaging device 165 advantageously collects the data without contacting the wafer 203 and is non-invasive. In some embodiments, the data collection by the optical imaging device 165 may be performed in-vacuum. In some embodiments, the data collection by the optical imaging device 165 may be performed with minimal time interruption to the normal semiconductor processing flow. Both the light source and the imager may be directed at an angle to the substrate, which may be substantially or directly perpendicular to the surface of the substrate, or at any angle offset from parallel, such as between 0° and 180°, or the substrate may be positioned proximate the device to cause impingement at any particular angle relative to a surface of the substrate. In some embodiments, any angle may be between about 15° and about 165°, between about 30° and about 150°, between about 45° and about 135°, between about 60° and about 120°, between about 75° and about 105°, or more, to be closer to perpendicular.

The light source and the imaging device may be positioned at any angle relative to the wafer being read. However, the imaging device may include a correction to produce an effective line of sight that is perpendicular to the wafer surface when interpreting color. For example, film color may be affected by an angle of tilt at which the surface is viewed. The color viewed may be based, for example, on the thickness of the film through which light travels before reaching an imager to produce an optical path length. For example, when viewed perpendicular to the surface, light will have traveled a distance of twice the thickness of the film, based on delivery and reflectance. However, at an angle of tilt, the light will have traveled at greater than twice the thickness of the film or a longer optical path length to account for the angle. Consequently, in some embodiments a correction may be applied to a reading to account for an optical path length, which may otherwise provide data indicating adjusted optical properties.

In some embodiments, the time to acquire images for a sample wafer may be about 20 seconds or less, and may be less than or about 15 seconds, less than or about 10 seconds, less than or about 5 seconds, or less. The reflectance data collected by the imager may be provided to the processing device 170. The reflectance data may be red, green, and blue ("RGB") data. RGB refers to a system for representing the colors that may be used on a computer display or communicated as data values. Red, green, and blue can be combined in various proportions to obtain any color in the visible spectrum. Levels of R, G, and B can each range from 0 to 100 percent of full intensity. Processing device 170 may translate the RGB data to a total rgb space for all pixels in the raw image. The processing device 170 may convert the R, G, B values generated by the collected color images to rgb space pixel variation data. The processing device 170 may provide a plot for all pixels in the raw image to account for image intensities based upon RGB values. Any method may be utilized for calculating the RGB values as encompassed by the present technology.

In one non-limiting example, the "r" value may be calculated as r=R/(R+G+B), the "g" value may be calculated as g=G/(R+G+B), and the "b" value may be calculated as b=B/(R+G+B), or r=1−(b+g), where r+g+b=1. Again, it is to be understood that the present technology is not limited to the specific calculation noted, and other calculations for conversion of the data are equally encompassed by embodiments of the present technology. The calculations may involve translating 3-dimensional RGB values to a 2-dimensional plot of pixel variations. The calculations using the RGB values converted to total rgb space for all pixels in the raw image may then be compared to reference wafer library data. A reference wafer library data compiles data from "golden wafers" or reference wafers that have the desired properties related to stress, bow, thickness, and other properties. Such reference wafers may also conform to customer specifications. The difference in the data between a process sample wafer and the reference wafer data gives indication to a delta value that may correlate to a delta property value, such as delta stress. The reference wafer library data may include design of experiment based information for any considerable process conditions that can be used to tune processes for any number of deviations from the desired results.

Figure 4A:
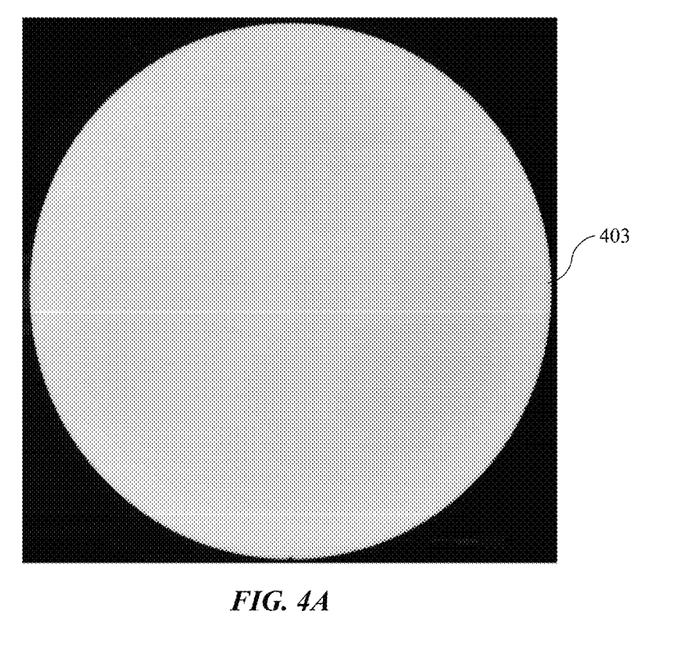
FIG. 4A shows a raw image of a semiconductor wafer according to some embodiments of the present technology.
Figure 4B:
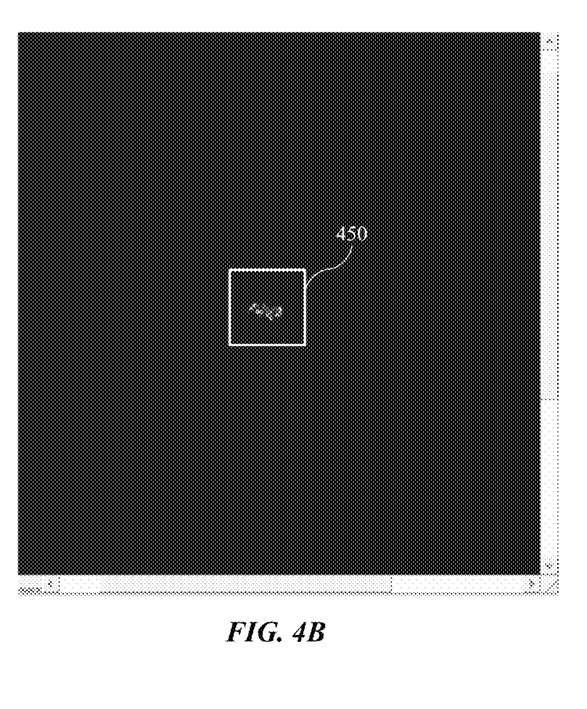
FIG. 4B shows the total rgb space for all pixels of the raw image of FIG. 4A.
Figure 4C:
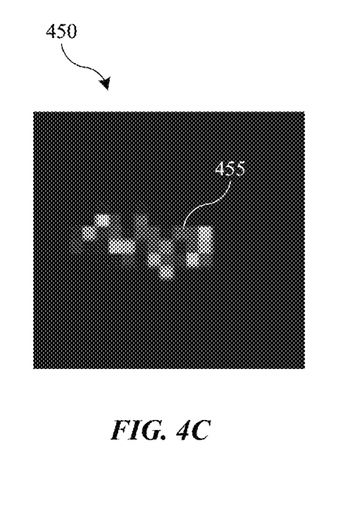
FIG. 4C shows an enlarged illustration of the image of FIG. 4B.

FIG. 4A shows a raw image of a semiconductor wafer according to an example. The image of the wafer surface 403 is captured in color. The image of FIG. 4A is then converted to the pixel variation plot as in FIG. 4B showing the total rgb space for all pixels of the raw image of FIG. 4A. In this example, the entire surface of the wafer is "mapped" in the plot of FIG. 4B. The area in box 450 of FIG. 4B is enlarged to show the plurality of pixels 455 as in FIG. 4C. The plot of FIG. 4B is generated by comparing the color intensity values as collected imaging FIG. 4A and then comparing to reference wafer library data. The reference wafer library data may be continually updated and refined as additional sample data is collected and provided to the database. While generally described herein are color analyses for entire wafer surfaces, alternatively individual or multiple locations within wafers may be analyzed for specifically identifying defects in a wafer.

Figure 5:
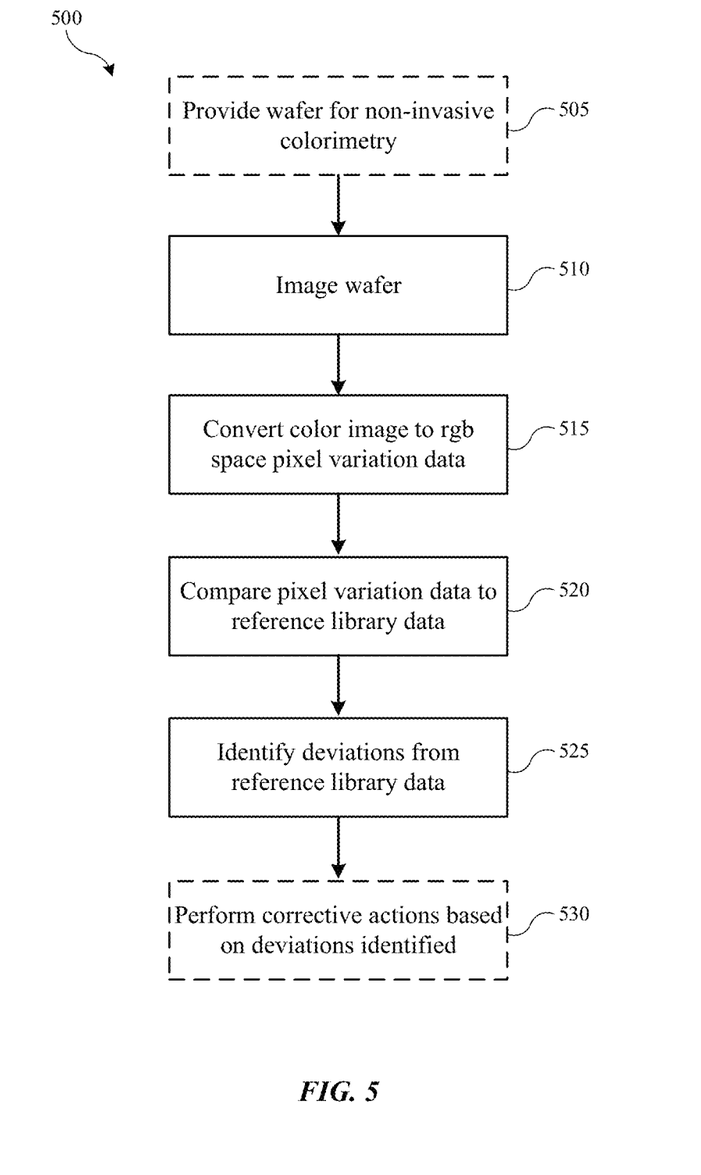
FIG. 5 shows exemplary operations in a controlling non-uniformity method according to some embodiments of the present technology.

FIG. 5 shows exemplary operations in a method 500 for controlling non-uniformity according to some embodiments of the present technology. Method 500 may include operations prior to the wafer imaging in some embodiments. For example, prior to the imaging, a wafer may have one or more deposition and/or etching operations performed as well as any planarization or other process operations performed. Method 500 may include a number of operations that may be performed automatically within a system to limit manual interaction, and to provide increased efficiency and precision over manual operations.

Method 500 may optionally include providing a wafer or a series of wafers for colorimetry at operation 505. Each wafer may be positioned at an appropriate angle and distance from the optical imaging device for imaging at operation 510. The optical imaging device may be disposed in various locations for imaging wafers without contact, such as within a lock load area or within a buffer chamber. In some embodiments, such as within the buffer chamber, the optical imaging device images the sample wafer surface while advantageously maintaining vacuum conditions on the multi-chamber processing system. By maintaining in-vacuum conditions, surface contamination onto the wafers is reduced.

Method 500 may include converting the color images including RGB values to rgb space pixel variation data at operation 515. This operation may be performed using a processing device to translate the RGB values collected from the color images (an example of which is shown in FIG. 4A) to the intensity variation plots (an example of which is shown in FIG. 4B). The processing device may further be employed at operation 520 to compare the rgb space pixel variation data to reference library data. In some embodiments, the reference library data may be continuously updated and refined using data acquired from the color images. The wafers imaged at operation 510 may then be "flagged" or deemed to pass or fail at operation 525 for those identified as deviating from the wafer reference library data. The processing device may then optionally provide corrective actions at optional operation 530 based upon deviations identified at operation 525.

In some embodiments, a neural network may be included in processing device 170. The neural network may provide a model for generating outputs. The model may be BKM algorithm based or shift-and-add algorithm based. The processing device may continually update data to expand the reference library database. The processing device may be trained to recognize wafer deviations as well as trends to provide corrective actions. The deviations may be correlated to various properties such as, but not limited to, stress, bow, and thickness. Corrective actions may include individual actions or actions related to processing parameters based upon trends showing deviations from reference library data. An individual correction may include wafer rejection such as tagging a specific wafer or series of wafers for removal from further production based upon one or more identified deviations. Trends that indicate intensities progressively deviating from reference library data may provide indication that a process recipe needs to be augmented, and/or a chamber requires cleaning, and/or a showerhead or other component replacement is recommended. Trends identified during operation 525 may greatly improve process efficiencies. Rather than cleaning chambers at prescribed intervals, cleaning may be postponed until data trends observe deviations as in operation 530. This may either extend the time between scheduled cleanings, or identify a cleaning requirement prior to loss of substrates due to out-of-tolerance processing. This may also improve chamber uptime, by reducing the frequency of qualification runs or part maintenance, as the wafer imager may monitor each and every wafer being processed.

Figure 6:
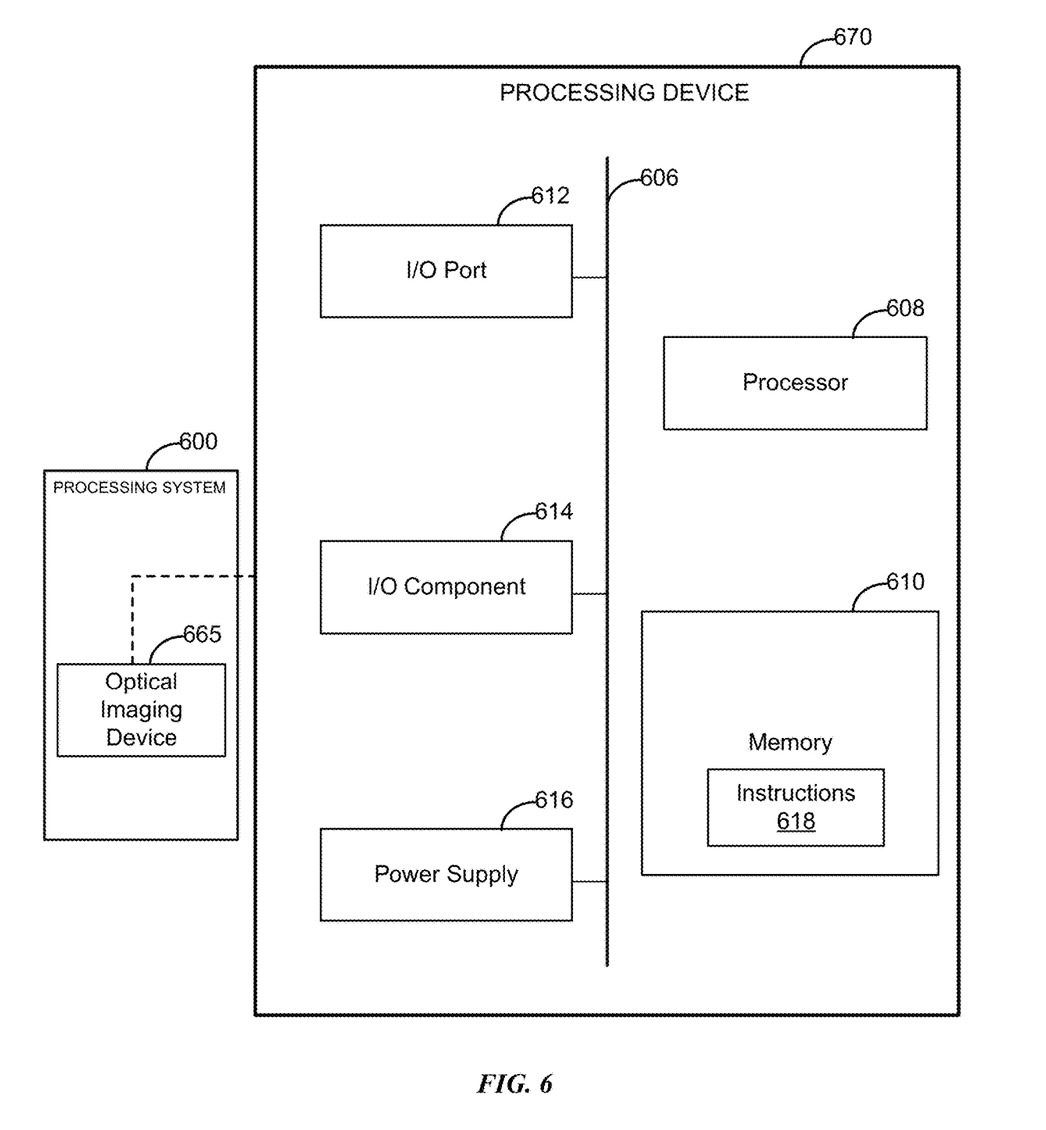
FIG. 6 shows a block diagram depicting an illustrative stress non-uniformity control system according to some embodiments of the present technology.

FIG. 6 shows a block diagram depicting an illustrative processing system 600 for non-uniformity control according to some embodiments of the present technology. As shown, the system 600 may include an optical imaging device 665. The optical imaging device may be configured to receive a reflectance data including RGB values, as described previously. In some embodiments, the processing system 600 may be, be similar to, include, or be included within the system 100 and/or any of its components depicted in FIG. 1, and the optical imaging device 665 may be, be similar to, include, or be included within the device 165 and/or any of its components depicted in FIGS. 1 and 3.

The system 600 may further include a processing device 670 communicatively coupled to optical imaging device 665. Processing device 670 may be configured to translate color images received by optical imaging device 665, convert color image RGB data to rgb space pixel variation data, compare pixel variation data to reference library data, identify one or more deviations from reference library data, and provide corrective actions based on deviations identified. The processing device 670 may include any type of computing device suitable for implementing aspects of embodiments of the present technology. Examples of computing devices include specialized computing devices or general-purpose computing devices such as workstations, servers, laptops, desktops, tablet computers, hand-held devices, smartphones, general-purpose graphics processing units, and the like, all of which are encompassed within the scope of FIG. 6. Processing device 670 may include a neural network as described above for continually expanding a data set for feed forward recognition.

In some embodiments, the processing device 670 may include a bus 606 that, directly and/or indirectly, couples the following devices: a processor 608, a memory 610, an input/output (I/O) port 612, an I/O component 614, and a power supply 616. Any number of additional components, different components, and/or combinations of components may also be included in the processing device 670. The I/O component 614 may include a presentation component configured to present information to a user such as, for example, a display device, a speaker, a printing device, and/or the like, and/or an input component such as, for example, a microphone, a joystick, a satellite dish, a scanner, a printer, a wireless device, a keyboard, a pen, a voice input device, a touch input device, a touch-screen device, an interactive display device, a mouse, and/or the like. The bus 606 represents what may be one or more busses, such as, for example, an address bus, data bus, or some combination of these or other components. Similarly, in some embodiments, the processing device 670 may include a number of processors 608, a number of memory components 610, a number of I/O ports 612, a number of I/O components 614, and/or a number of power supplies 616. Additionally any number of these components, or combinations thereof, may be distributed and/or duplicated across a number of computing devices. In some embodiments, the processor 608 may load the rgb space pixel variation data into the memory 610 to compare to pixel variation data to reference library data.

In some embodiments, the memory 610 includes computer-readable media in the form of volatile and/or nonvolatile memory and may be removable, nonremovable, or a combination thereof. Media examples include Random Access Memory (RAM); Read Only Memory (ROM); Electronically Erasable Programmable Read Only Memory (EEPROM); flash memory; optical or holographic media; magnetic cassettes, magnetic tape, magnetic disk storage or other magnetic storage devices; data transmissions; and/or any other medium that can be used to store information and can be accessed by a computing device such as, for example, quantum state memory, and/or the like. In embodiments, the memory 610 may store computer-executable instructions 618 for causing the processor 608 to implement aspects of embodiments of system components discussed herein and/or to perform aspects of embodiments of methods and procedures discussed herein.

The computer-executable instructions 618 may include, for example, computer code, machine-useable instructions, and the like such as, for example, program components capable of being executed by one or more processors 608 associated with the processing device 670. For example, in embodiments, the computer-executable instructions 618 may be configured to cause the one or more processors 608 to initiate an application configured to facilitate any number of different aspects of controlling non-uniformity and for implementing aspects of embodiments of the present technology. Program components may be programmed using any number of different programming environments, including various languages, development kits, frameworks, and/or the like. Some or all of the functionality contemplated herein may also, or alternatively, be implemented in hardware and/or firmware.

The illustrative system 600 shown in FIG. 6 is not intended to suggest any limitation as to the scope of use or functionality of embodiments of the present technology. The illustrative system 600 also should not be interpreted as having any dependency or requirement related to any single component or combination of components illustrated therein. Additionally, various components depicted in FIG. 6 may be, in embodiments, integrated with various ones of the other components depicted therein and/or components not illustrated, all of which are considered to be encompassed by the present technology.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the material" includes reference to one or more materials and equivalents thereof known to those skilled in the art, and so forth.

Also, the words "comprise(s)", "comprising", "contain(s) ", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of controlling stress non-uniformity for semiconductor processing, the method comprising:
    reflecting light off a surface of a wafer with an optical imaging device disposed within a cluster tool, wherein the cluster tool comprises a multi-chamber processing system;
    collecting one or more color images of the surface of the wafer;
    converting the one or more color images to sample stress intensity data;
    comparing the sample stress intensity data to reference wafer stress intensity data;
    identifying deviations of the sample stress intensity data relative to the reference wafer stress intensity data;
    determining corrective actions that would cause stress intensity of the wafer to conform with the reference wafer stress intensity data; and
    implementing the corrective actions on the multi-chamber processing system.

2. The method of controlling stress non-uniformity of claim 1, further comprising:
    transferring the wafer from a first semiconductor processing chamber to the optical imaging device.

3. The method of controlling stress non-uniformity of claim 2, wherein the transferring is performed while maintaining vacuum conditions on the multi-chamber processing system.

4. The method of controlling stress non-uniformity of claim 1, further comprising:
    transferring the wafer from the optical imaging device to a second semiconductor processing chamber.

5. The method of controlling stress non-uniformity of claim 1, wherein the sample stress intensity data is rgb space pixel variation data.

6. The method of controlling stress non-uniformity of claim 1, wherein the optical imaging device includes a light source directed to the surface of the wafer at an angle offset from perpendicular to a surface of the wafer.

7. The method of controlling stress non-uniformity of claim 1, wherein the optical imaging device includes collecting reflectance data at a line of sight perpendicular to a surface of the wafer.

8. The method of controlling stress non-uniformity of claim 1, wherein implementing the corrective actions on the multi-chamber processing system includes at least one of changing a process recipe, cleaning a process chamber, or replacing a process component.

9. The method of controlling stress non-uniformity of claim 8, wherein the process component includes a showerhead.

10. A method of controlling non-uniformity for semiconductor processing, the method comprising:
    imaging a reference wafer with an optical imaging device disposed within a cluster tool to generate reflectance data from a reference surface, wherein the cluster tool comprises a multi-chamber processing system;
    imaging a sample wafer with the optical imaging device to generate reflectance data from a sample surface;
    translating the reflectance data from the reference surface to a first set of rgb space pixel variation data with a processor;
    translating the reflectance data from the sample surface to a second set of rgb space pixel variation data;
    identifying deviations between the second set of rgb space pixel variation data relative to the first set of rgb space pixel variation data;
    correlating the deviations with a stress intensity on the sample wafer;
    determining corrective actions that would cause the stress intensity on the sample wafer to conform with a stress intensity on the reference wafer; and
    implementing the corrective actions into the multi-chamber processing system.

11. The method of controlling non-uniformity of claim 10, further comprising imaging a plurality of reference wafers with the optical imaging device to generate reflectance data from a plurality of reference surfaces to provide a reference data library.

12. The method of controlling non-uniformity of claim 10, further comprising:
    transferring the sample wafer from a first semiconductor processing chamber to the optical imaging device, wherein the transferring is performed while maintaining vacuum conditions on the multi-chamber processing system.

13. The method of controlling non-uniformity of claim 10, further comprising:
    transferring the sample wafer from the optical imaging device to a second semiconductor processing chamber, wherein the transferring is performed while maintaining vacuum conditions on the multi-chamber processing system.

14. A multi-chamber processing system comprising:
    an optical imaging device configured to image a sample wafer surface and to collect sample reflectance data;
    at least one semiconductor processing chamber;
    one or more processors; and
    one or more memory devices comprising instructions that, when executed by the one or more processors, cause the one or more processors to perform operations comprising:

translating the sample reflectance data to a sample plot of pixel variation in rgb space, providing the sample plot of pixel variation in the rgb space to a model trained to recognize deviations from reference plots of pixel variation in the rgb space, and receiving outputs from the model that provide feed forward corrective actions to processing variables to bring the sample plot of pixel variation in rgb space into conformity with the reference plot of pixel variation in rgb space.

15. The multi-chamber processing system of claim 14, further comprising a buffer chamber, wherein the optical imaging device is disposed within the buffer chamber and configured to image a wafer without contacting the wafer.

16. The multi-chamber processing system of claim 15, wherein the optical imaging device is configured to image the sample wafer surface while maintaining vacuum conditions on the multi-chamber processing system.

17. The multi-chamber processing system of claim 14, wherein the optical imaging device is disposed within a load lock area for imaging a wafer without contacting the wafer.

* * * * *